United States Patent
Kim et al.

(10) Patent No.: US 11,765,929 B2
(45) Date of Patent: Sep. 19, 2023

(54) DISPLAY DEVICE INCLUDING SEALANT FILLED FLEXIBLE FILM HOLES

(71) Applicant: LG Display Co., Ltd., Seoul (KR)

(72) Inventors: MinSeok Kim, Seoul (KR); Gyujae Yohn, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 241 days.

(21) Appl. No.: 17/100,043

(22) Filed: Nov. 20, 2020

(65) Prior Publication Data

US 2021/0167328 A1    Jun. 3, 2021

(30) Foreign Application Priority Data

Nov. 28, 2019  (KR) .......................... 10-2019-0155106

(51) Int. Cl.
| | | |
|---|---|---|
| *H01L 51/00* | (2006.01) | |
| *H01L 51/52* | (2006.01) | |
| *H01L 27/32* | (2006.01) | |
| *H01L 33/44* | (2010.01) | |
| *H01L 27/146* | (2006.01) | |

(52) U.S. Cl.
CPC ...... *H01L 51/5253* (2013.01); *H01L 51/0097* (2013.01); *H01L 51/5246* (2013.01); *H01L 27/14678* (2013.01); *H01L 27/323* (2013.01); *H01L 33/44* (2013.01); *H01L 2251/301* (2013.01); *H01L 2251/5338* (2013.01)

(58) Field of Classification Search
CPC ............. H01L 51/5253; H01L 51/0097; H01L 51/5246; H01L 51/5237; H01L 2251/5338; H01L 2251/301; H01L 27/323; H01L 27/14678; H01L 33/44; G02F 1/133305; G02F 2001/133357; G09F 9/301
See application file for complete search history.

(56) References Cited

U.S. PATENT DOCUMENTS

| | | | |
|---|---|---|---|
| 10,939,564 B2 * | 3/2021 | Xie ...................... | H05K 5/0017 |
| 2015/0302815 A1 * | 10/2015 | Marushima .......... | G09G 3/3677 |
| | | | 345/3.2 |

(Continued)

FOREIGN PATENT DOCUMENTS

| | | |
|---|---|---|
| CN | 101894816 A | 11/2010 |
| CN | 106024744 A | 10/2016 |

(Continued)

OTHER PUBLICATIONS

Chinese Office Action dated Jun. 30, 2022 issued in Patent Application No. 202011287140.3 w/English Translation (16 pages).

*Primary Examiner* — Ida M Soward
(74) *Attorney, Agent, or Firm* — Polsinelli PC (57) ABSTRACT

A display device according to an exemplary aspect of the present disclosure includes a display panel including a display area and a non-display area, a flexible film disposed on the non-display area of the display panel, and a sealing member disposed on an overlapping area of the display panel and the flexible film to cover the flexible film, the flexible film includes a plurality of holes which passes through the flexible film in the overlapping area of the display panel and the flexible film, and the sealing member may be disposed to fill in the plurality of holes. Accordingly, the sealing member is filled in an area between the display panel and the flexible film so that the bonding reliability may be improved.

20 Claims, 6 Drawing Sheets

(56) References Cited

U.S. PATENT DOCUMENTS

| | | | | |
|---|---|---|---|---|
| 2016/0172428 A1* | 6/2016 | Song | .................... | H01L 51/0097 |
| | | | | 257/40 |
| 2017/0127512 A1* | 5/2017 | Park | ..................... | H05K 1/0271 |
| 2017/0170255 A1* | 6/2017 | Ha | .......................... | G09F 9/301 |
| 2017/0332495 A1* | 11/2017 | Kim | ..................... | G09G 3/2092 |
| 2018/0020550 A1* | 1/2018 | Jang | ....................... | H05K 1/111 |
| 2018/0031751 A1* | 2/2018 | Sugiyama | .............. | G02B 6/009 |
| 2018/0183003 A1* | 6/2018 | Han | .................... | H01L 27/1262 |
| 2019/0004653 A1* | 1/2019 | Won | ...................... | G06F 3/0443 |
| 2019/0229177 A1* | 7/2019 | Kim | ..................... | G09G 3/3233 |
| 2019/0237533 A1* | 8/2019 | Kim | ...................... | G06F 3/0412 |
| 2020/0152907 A1* | 5/2020 | Oh | ...................... | H01L 51/5243 |
| 2020/0176699 A1* | 6/2020 | Lee | .................... | H01L 27/3246 |
| 2020/0218391 A1* | 7/2020 | Kamiya | ................ | G06F 3/0446 |
| 2020/0235194 A1* | 7/2020 | Ito | ....................... | H01L 51/5246 |

FOREIGN PATENT DOCUMENTS

| | | |
|---|---|---|
| CN | 106356467 A | 1/2017 |
| CN | 106960860 A | 7/2017 |
| CN | 107037917 A | 8/2017 |
| CN | 107799003 A | 3/2018 |
| CN | 108022956 A | 5/2018 |
| CN | 108257509 A | 7/2018 |
| KR | 10-2008-0054602 A | 6/2008 |
| KR | 10-2018-0003716 A | 1/2018 |
| KR | 10-2018-0062519 A | 6/2018 |
| WO | 2019058777 A1 | 3/2019 |

\* cited by examiner

DISPLAY DEVICE INCLUDING SEALANT FILLED FLEXIBLE FILM HOLES

CROSS REFERENCE TO RELATED APPLICATION

This application claims the priority of Korean Patent Application No. 10-2019-0155106 filed on Nov. 28, 2019, which is hereby incorporated by reference in its entirety.

BACKGROUND

Field of the Disclosure

The present disclosure relates to a display device, and more particularly, to a display device which improves a reliability of a pad unit.

Description of the Background

Recently, as it enters the full-fledged information era, a display field which visually expresses electrical information signals has been rapidly developed and in response to this, various display apparatuses having excellent performances such as thin-thickness, light weight, and low power consumption have been developed. Specific examples of the above-mentioned display apparatus include a liquid crystal display apparatus (LCD) and an electroluminescence display apparatus such as an organic light emitting display apparatus (OLED) and a quantum-dot light emitting display apparatus (QLED).

Generally, the display device includes a display panel which has a display area and a non-display area, a driving circuit which applies signals to the display panel, and a printed circuit board (PCB) which supplies various control signals to the driving circuit. The display area displays images and the non-display area is defined along a periphery of the display area. In this case, a process of electrically connecting the display panel and the driving circuit is performed and the process is classified into a chip on glass (COG) method, a chip on film (COF) method, and a tape automated bonding (TAB) method depending on a mounting method of the driving circuit.

In the meantime, according to the COG method, the driving circuit needs to be directly mounted on the substrate of the display panel so that there is a limitation to reduce a bezel area. Therefore, according to the COF and the TAB method which mount the driving circuit in a separate base material to connect the driving circuit and the display panel, the driving circuit may be disposed on a side surface of the display panel or disposed on a rear surface of the display panel so that the narrow bezel may be implemented. However, there may be reliability issue.

SUMMARY

Accordingly, the present disclosure is to provide a display device which disposes a sealing member to be filled in an overlapping area between the display panel and the flexible film to improve a reliability of a pad unit.

The present disclosure is also to provide a display device which disposes a protective layer of the flexible film at an outside of the sealing member so that the sealing member is effectively cured.

The present disclosure is also to provide a display device which disposes an auxiliary adhesive layer in a partial area of a flexible film to allow the display panel and the flexible film to be easily bonded.

The present disclosure is not limited to the above-mentioned objects, and other objects, which are not mentioned above, can be clearly understood by those skilled in the art from the following descriptions.

According to an aspect of the present disclosure, there is provided a display device. The display device includes a display panel including a display area and a non-display area. The display device further includes a flexible film disposed on the non-display area of the display panel. The display device further includes a sealing member disposed on an overlapping area of the display panel and the flexible film to cover the flexible film. The flexible film includes a plurality of holes which passes through the flexible film in the overlapping area of the display panel and the flexible film. The sealing member is disposed to be filled in the plurality of holes.

According to another aspect of the present disclosure, there is provided a display device. The display device includes a substrate including a display area and a non-display area. The display device further includes a flexible film disposed on the non-display area and connected to the substrate by a conductive adhesive layer. The display device further includes a micro coating layer on an overlapping area of the substrate and the flexible film and disposed to surround the conductive adhesive layer. The flexible film includes a plurality of holes which passes through the flexible film in the overlapping area of the substrate and the flexible film. The micro coating layer is disposed to be filled in an area between the substrate and the flexible film on the overlapping area of the substrate and the flexible film.

Other detailed matters of the exemplary aspects are included in the detailed description and the drawings.

According to the present disclosure, a plurality of holes which passes through the flexible film is formed in an area of the flexible film which overlaps the display panel so that the sealing member is filled also in the area between the display panel and the flexible film so that the bonding reliability is improved.

According to the present disclosure, the protective layer of the flexible film is disposed at the outside of the sealing member so that the sealing member may be effectively cured.

According to the present disclosure, the auxiliary adhesive layer is disposed on an area of the flexible film which is bonded to the display panel to improve the adhesiveness of the display panel and the flexible film.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, the present disclosure will be described in detail with reference to accompanying drawings.

Figure 1:
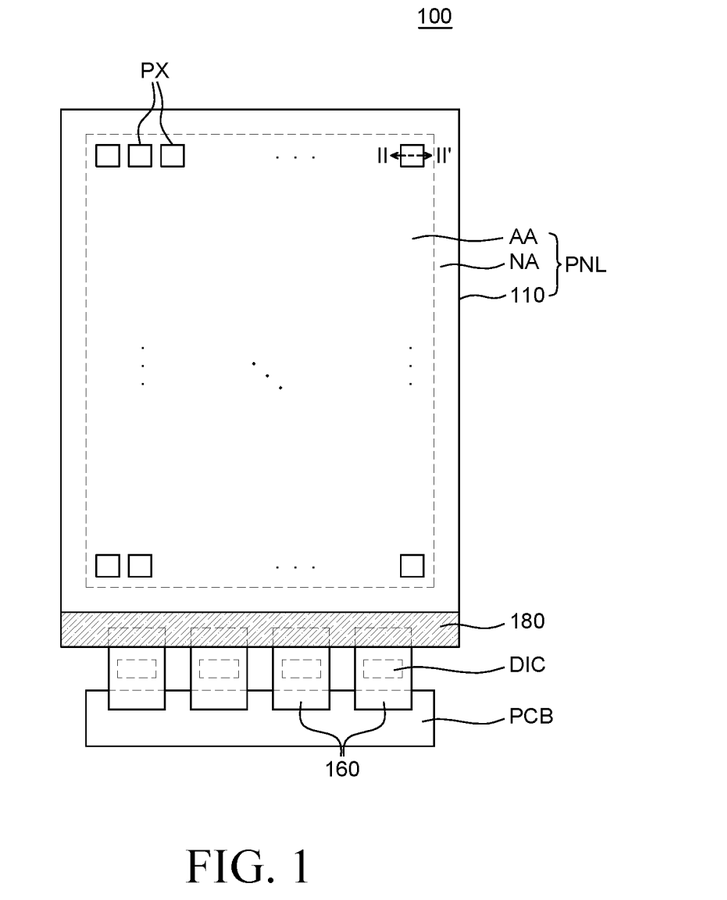
FIG. 1 is a plan view of a display device according to an exemplary aspect of the present disclosure.
Figure 2:
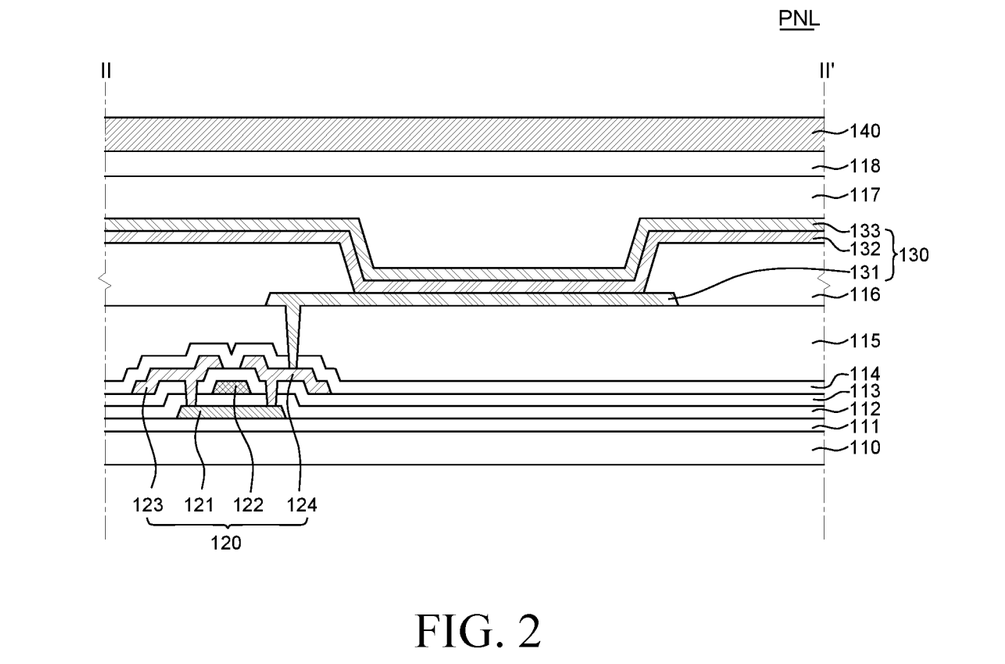
FIG. 2 is a cross-sectional view taken along line II-IF of FIG. 1.
Figure 3:
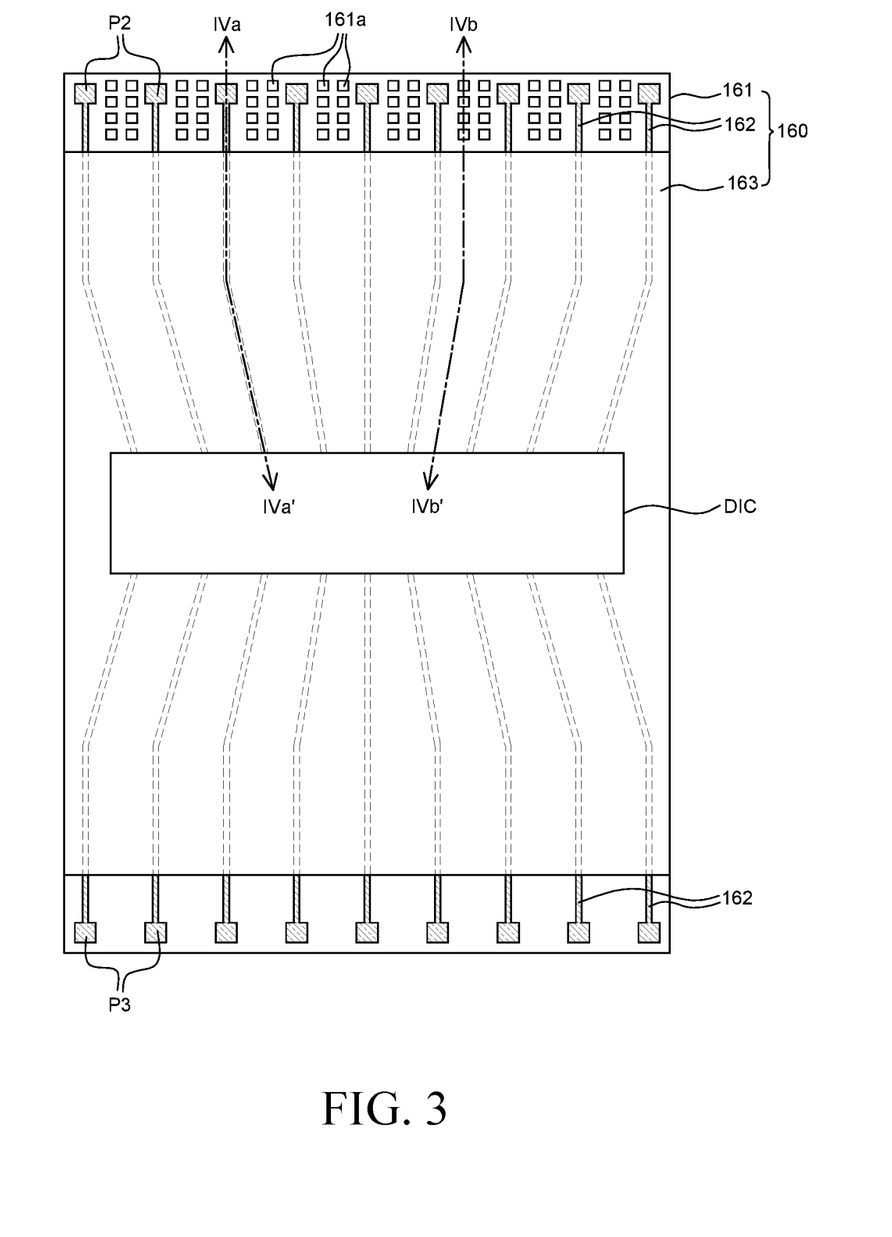
FIG. 3 is a plan view of a flexible film according to an exemplary aspect of the present disclosure.

FIG. 1 is a plan view of a display device according to an exemplary aspect of the present disclosure. FIG. 2 is a cross-sectional view taken along line II-IF of FIG. 1. FIG. 3 is a plan view of a flexible film according to an exemplary aspect of the present disclosure.

Referring to FIGS. 1 to 3, a display device 100 includes a display panel PNL, a flexible film 160, a printed circuit board PCB, and a sealing member 180.

Referring to FIG. 1, the display panel PNL is a panel which displays images to a user. The display panel PNL includes a substrate 110 including a display area AA and a non-display area NA. In the meantime, in FIG. 1, for the convenience of illustration, an encapsulating substrate 140 is omitted. However, substantially, the encapsulating substrate 140 may be disposed above the substrate 110 of FIG. 1. The encapsulating substrate 140 will be described below with reference to FIG. 2.

The display area AA is an area where images are displayed in the display panel PNL. In the display area AA, a plurality of pixels PX and a driving circuit for driving the plurality of pixels PX may be disposed. Each of the plurality of pixels PX may include a plurality of sub pixels. The plurality of sub pixels is minimum units which configure the display area AA and a display element may be disposed in each of the plurality of sub pixels. For example, an organic light emitting diode which includes an anode, an organic light emitting layer, and a cathode may be disposed in each of the plurality of sub pixels, but it is not limited thereto. Further, the driving circuit drives the plurality of sub pixels and includes driving elements, wiring lines, and the like. For example, the driving circuit may be configured by a thin film transistor, a storage capacitor, a gate line, a data line, and the like, but is not limited thereto.

The non-display area NA is an area where no image is displayed. The non-display area NA is disposed so as to surround the display area AA. In the non-display area NA, various wiring lines and circuits for driving the organic light emitting diode of the display area AA are disposed. For example, in the non-display area NA, a link line which transmits signals to the plurality of sub pixels and driving circuits of the display area AA or a driving IC such as a gate driver IC or a data driver IC may be disposed, but the non-display area is not limited thereto.

In the meantime, the display panel PNL may be configured by a top emission type or a bottom emission type, depending on an emission direction of light which is emitted from the organic light emitting diode.

According to the top emission type, light emitted from the organic light emitting diode is emitted to an upper portion of the substrate 110 on which the organic light emitting diode is formed. In the case of the top emission type, a reflective layer may be formed below the anode to allow the light emitted from the organic light emitting diode to travel to the upper portion of the substrate 110, that is, toward the cathode.

According to the bottom emission type, light emitted from the organic light emitting diode is emitted to a lower portion of the substrate 110 on which the organic light emitting diode is formed. In the case of the bottom emission type, the anode may be formed only of a transparent conductive material to allow the light emitted from the organic light emitting diode to travel to the lower portion of the substrate 110 and the cathode may be formed of the metal material having a high reflectance.

Hereinafter, for the convenience of description, the description will be made by assuming that the display device 100 according to the exemplary aspect of the present disclosure is a bottom emission type display device 100. That is, the display device 100 according to the exemplary aspect of the present disclosure may emit light toward a rear surface of the display panel PNL of FIG. 1, but the present disclosure is not limited thereto.

Referring to FIG. 2, the display panel PNL includes a substrate 110, a transistor 120, a light emitting diode 130, an encapsulating layer 117, and an encapsulating substrate 140.

The substrate 110 is a substrate which supports and protects several components of the display panel PNL. The substrate 110 may be formed of a plastic material having flexibility. Further, since the display panel PNL is a bottom emission type, in order to allow the light to travel to a lower part of the substrate 110, the substrate 110 may be formed of an insulating material having a transparency. For example, the substrate 110 may be formed of transparent polyimide (PI).

A buffer layer 111 is disposed on the substrate 110. The buffer layer 111 may enhance an adhesiveness between layers formed on the buffer layer 111 and the substrate 110. Further, the buffer layer 111 blocks alkali components leaked from the substrate 110 and suppress diffusion of moisture and/or oxygen which permeates from the outside of the substrate 110. The buffer layer 111 may be configured by a single layer or a multi-layer of silicon nitride (SiNx) or silicon oxide (SiOx), but is not limited thereto. Further, the buffer layer 111 may be omitted based on a type or a material of the substrate 110 and a structure and a type of the transistor 120.

The transistor 120 is disposed on the buffer layer 111 to drive the light emitting diode 130. The transistor 120 may be disposed in each of the plurality of sub pixels of the display area AA. The transistor 120 disposed in each of the plurality of sub pixels may be used as a driving element of the display device 100. For example, the transistor 120 may be a thin film transistor (TFT), an N-channel metal oxide semiconductor (NMOS) transistor, a P-channel metal oxide semiconductor (PMOS), a complementary metal oxide semiconductor (CMOS), transistor, a field effect transistor FET, or the like, but is not limited thereto. Hereinafter, it is assumed that the transistor 120 is a thin film transistor, but is not limited thereto.

The transistor 120 includes an active layer 121, a gate electrode 122, a source electrode 123, and a drain electrode 124. The transistor 120 illustrated in FIG. 2 is a top gate type thin film transistor in which the gate electrode 122 is disposed on the active layer 121. However, it is not limited thereto and the transistor 120 may be implemented by a bottom gate type thin film transistor.

The active layer 121 of the transistor 120 is disposed on the buffer layer 111. When the transistor 120 is driven, a channel is formed in the active layer 121. The active layer 121 may be formed of an oxide semiconductor or amorphous silicon (a-Si), polycrystalline silicon (poly-Si), or an organic semiconductor, but is not limited thereto.

A gate insulating layer 112 is disposed on the active layer 121. The gate insulating layer 112 may be formed as a single layer or a multi-layer of silicon nitride SiNx or silicon oxide SiOx. In the gate insulating layer 112, a contact hole through which the source electrode 123 and the drain electrode 124 are in contact with a source area and a drain area of the active layer 121, respectively, is formed. The gate insulating layer 112 may be formed on the entire surface of the flexible substrate 110 as illustrated in FIG. 2, or patterned to have the same width as the gate electrode 122, but is not limited thereto.

The gate electrode 122 is disposed on the gate insulating layer 112. The gate electrode 122 is disposed on the gate insulating layer 112 so as to overlap a channel area of the active layer 121. The gate electrode 122 may be formed of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multi-layer thereof, but it is not limited thereto.

An interlayer insulating layer 113 is disposed on the gate electrode 122. The interlayer insulating layer 113 may be formed as a single layer or a multi-layer of silicon nitride SiNx or silicon oxide SiOx which is an inorganic material. In the interlayer insulating layer 113, a contact hole through which the source electrode 123 and the drain electrode 124 are in contact with the source area and the drain area of the active layer 121, respectively, is formed.

The source electrode 123 and the drain electrode 124 are disposed on the interlayer insulating layer 113. The source electrode 123 and the drain electrode 124 are electrically connected to the active layer 121 through the contact holes of the gate insulating layer 112 and the interlayer insulating layer 113. The source electrode 123 and the drain electrode 124 may be formed of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multi-layer thereof. However, the present disclosure is not limited thereto.

For the convenience of description, in FIG. 2, only a driving transistor, among various transistors 120 included in the display device 100, is illustrated, but other transistors such as a switching transistor may also be disposed.

Referring to FIG. 2, a passivation layer 114 for protecting the transistor 120 is disposed on the transistor 120. A contact hole which exposes the drain electrode 124 of the transistor 120 is formed in the passivation layer 114. Even though in FIG. 2, the contact hole which exposes the drain electrode 124 is formed in the passivation layer 114, a contact hole which exposes the source electrode 123 may also be formed. The passivation layer 114 may be configured as a single layer or a multi-layer of silicon nitride SiNx or silicon oxide SiOx. However, the passivation layer 114 may be omitted depending on the exemplary aspect.

An over coating layer 115 is disposed on the passivation layer 114 to planarize an upper portion of the transistor 120. A contact hole which exposes the drain electrode 124 of the transistor 120 is formed in the over coating layer 115. Even though in FIG. 2, the contact hole which exposes the drain electrode 124 is formed in the over coating layer 115, a contact hole which exposes the source electrode 123 may also be formed. The over coating layer 115 may be formed of any one of acrylic resin, epoxy resin, phenol resin, polyamide resin, polyimide resin, unsaturated polyester resin, polyphenylene resin, polyphenylene sulfide resin, benzocyclobutene, and photoresist, but is not limited thereto.

Referring to FIG. 2, the light emitting diode 130 is disposed on the over coating layer 115. The light emitting diode 130 includes a first electrode 131 which is formed on the over coating layer 115 to be electrically connected to the drain electrode 124 of the transistor 120, a light emitting layer 132 disposed on the first electrode 131, and a second electrode 133 formed on the light emitting layer 132. Here, the first electrode 131 may be an anode electrode and the second electrode 133 may be a cathode electrode.

The first electrode 131 is disposed on the over coating layer 115 to be electrically connected to the drain electrode 124 through contact holes formed in the passivation layer 114 and the over coating layer 115. The first electrode 131 may be formed of a conductive material having a high work function to supply holes to the light emitting layer 132. For example, the first electrode 131 may be formed of transparent conductive oxide such as indium tin oxide (ITO), indium zinc oxide (IZO), indium tin zinc oxide (ITZO), zinc oxide (ZnO), and tin oxide (TO), but is not limited thereto.

Even though in FIG. 2, it is illustrated that the first electrode 131 is electrically connected to the drain electrode 124 of the transistor 120 through a contact hole, the first electrode 131 may also be configured to be electrically connected to the source electrode 123 of the transistor 120 through a contact hole depending on the type of the transistor 120 and a design method of the driving circuit.

A bank 116 is disposed on the first electrode 131 and the over coating layer 115. The bank 116 may cover an edge of the first electrode 131 of the light emitting diode 130 to define an emission area. The bank 116 is disposed at the boundary between the sub pixels which are adjacent to each other to reduce the color mixture of light emitted from the light emitting diode 130 of each of the plurality of sub pixels. The bank 116 may be formed of an organic material. For example, the bank 116 may be formed of polyimide resin, acrylic resin, or benzocyclobutene (BCB) resin, but is not limited thereto.

The light emitting layer 132 is disposed on the first electrode 131. The light emitting layer 132 is a layer for emitting light having a specific color and includes one of a red light emitting layer, a green light emitting layer, a blue light emitting layer, and a white light emitting layer. Further, the light emitting layer 132 may further include various layers such as a hole transport layer, a hole injection layer, a hole blocking layer, an electron injection layer, an electron blocking layer, or an electron transport layer. In the meantime, when the light emitting layer 132 is a white light emitting layer, color filters having various colors may be additionally disposed.

The second electrode 133 is disposed on the light emitting layer 132. The second electrode 133 supplies electrons to the light emitting layer 132. The second electrode 133 may be formed of a conductive material having a low work function. For example, the second electrode 133 may be formed of any one or more selected from the group consisting of conductive metals such as magnesium (Mg), silver (Ag), aluminum (Al), and calcium (Ca) and an alloy thereof, but is not limited thereto.

Referring to FIG. 2, the encapsulating layer 117 is disposed on the light emitting diode 130. The encapsulating layer 117 may cover the light emitting diode 130. The encapsulating layer 117 may protect the light emitting diode 130 from moisture, oxygen, and impacts of the outside. The encapsulating layer 117 may be formed by alternately laminating a plurality of inorganic layers and a plurality of organic layers. For example, the inorganic layer may be formed of an inorganic material such as silicon nitride SiNx, silicon oxide SiOx, and aluminum oxide AlOx and the organic layer may be formed of epoxy-based or acrylic-based polymer, but they are not limited thereto.

The encapsulating substrate 140 is disposed on the encapsulating layer 117. The encapsulating substrate 140 may protect the light emitting diode 130 from moisture, oxygen, and impacts of the outside, together with the encapsulating layer 117. The encapsulating substrate 140 may be formed of a metal material such as aluminum (Al), nickel (Ni), chrome (Cr), or an alloy material of iron (Fe) and nickel, but is not limited thereto.

Referring to FIG. 2, an adhesive member 118 is disposed between the encapsulating layer 117 and the encapsulating substrate 140. The adhesive member 118 may bond the encapsulating layer 117 and the encapsulating substrate 140 to each other. The adhesive member 118 is formed of a material having adhesiveness and may be a thermosetting or natural curable type adhesive. For example, the adhesive member 118 may be formed of an optical clear adhesive (OCA), a pressure sensitive adhesive (PSA), or the like, but is not limited thereto.

The adhesive member 118 may be disposed to enclose the encapsulating layer 117 and the light emitting diode 130. That is, even though in FIG. 2, the adhesive member 118 is disposed only above the encapsulating layer 117, the adhesive member 118 may be disposed to enclose side surfaces of the encapsulating layer 117 and the light emitting diode 130. For example, the light emitting diode 130 is covered by the encapsulating layer 117 and the light emitting diode 130 and the encapsulating layer 117 are covered by the adhesive member 118. The adhesive member 118 may protect the light emitting diode 130 from moisture, oxygen, and impacts of the outside together with the encapsulating layer 117 and the encapsulating substrate 140. In this case, the adhesive member 118 may further include an absorbent. The absorbent may be particles having hygroscopicity and absorb moisture and oxygen from the outside to minimize permeation of the moisture and oxygen into the light emitting diode 130.

In the meantime, the display panel PNL further includes a link line 150 and a first pad P1 to be described below with reference to FIGS. 4A and 4B. A plurality of link lines 150 and a plurality of first pads P1 may be provided. The link line 150 extends from the display area AA to the non-display area NA. One end of the link line 150 is connected to the plurality of pixels of the display area AA and the other end is connected to the first pad P1. That is, the link line 150 may electrically connect the first pad P1 and the pixel. In this case, the first pad PA1 is disposed on the non-display area NA to be connected to the flexible film 160. Therefore, the link line 150 may transmit the signal from the first pad P1 to the plurality of pixels of the display area AA. The link line 150 and the first pad P1 may be formed by the same material and the same process as any one of the gate electrode 122, the source electrode 123, the drain electrode 124, the first electrode 131, and the second electrode 133, but are not limited thereto.

Referring to FIG. 1, the flexible film 160 is disposed on the non-display area NA of the display panel PNL. The flexible film 160 may supply the driving signal to the plurality of pixels PX and the driving circuit of the display area AA. The flexible film 160 may be electrically connected to the display panel PNL through the first pad P1 disposed on the non-display area NA. Specifically, one end of the flexible film 160 is disposed on the non-display area NA of the display panel PNL to supply a power voltage or a data voltage to the plurality of pixels and the driving circuits of the display area AA. In the meantime, even though the number of flexible films 160 is four in FIG. 1, the number of flexible films 160 may vary depending on the design, but is not limited thereto.

Referring to FIG. 3, the flexible film 160 includes a base layer 161, a conductive layer 162, a protective layer 163, a second pad P2, a third pad P3, and a plurality of holes 161a.

The base layer 161 may be a flexible insulating film which supports components of the flexible film 160. The base layer 161 may include polycarbonate, polyethylene terephthalate, polyimide, polyamide, polyester, polyacrylate, polymethyl methacrylate, or the like, but is not limited thereto.

The conductive layer 162 is disposed on the base layer 161. One end portion of a part of the conductive layer 162 is connected to the second pad P2 and the other end portion may be connected to the driving IC DIC. Therefore, a part of the conductive layer 162 may electrically connect the display panel PNL and the driving IC DIC. Further, one end portion of the other part of the conductive layer 162 is connected to the third pad P3 and the other end portion is connected to the driving IC DIC. Therefore, the other part of the conductive layer 162 may electrically connect the driving IC DIC and the printed circuit board PCB. As a plurality of conductive layers 162 is provided, the conductive layers may be connected to the plurality of pixels PX of the display panel PNL. The plurality of conductive layers 162 may be formed of a metal material including copper (Cu), silver (Ag), gold (Au), aluminum (Al), or the like, but is not limited thereto.

The second pad P2 is disposed at one end portion of the base layer 161. For example, with respect to FIG. 3, the second pad P2 may be disposed at an upper end portion of the base layer 161. The second pad P2 is connected to the first pad P1 of the display panel PNL to electrically connect the flexible film 160 and the display panel PNL. The second pad P2 may be simultaneously formed by the same material as the conductive layer 162 and may be integrally formed with the conductive layer 162.

The third pad P3 is disposed at the other end portion of the base layer 161. For example, with respect to FIG. 3, the third pad P3 may be disposed at a lower end portion of the base layer 161. The third pad P3 is connected to the pad of the printed circuit board PCB to electrically connect the flexible film 160 and the printed circuit board PCB. The third pad P3 may be simultaneously formed by the same material as the conductive layer 162 and may be integrally formed with the conductive layer 162.

The protective layer 163 is disposed on the base layer 161 to cover the conductive layer 162. The protective layer 163 may protect the components of the flexible film 160. For example, the protective layer 163 may protect the components of the flexible film 160 from the external impact. Further, when the display device 100 is manufactured, a support substrate is disposed below the substrate 110 to perform the process and the support substrate may be separated after completing the process. The support substrate is removed by a laser lift off (LLO) process so that the protective layer 163 suppresses the damage in the flexible film 160 caused due to the laser light during the LLO process.

In this case, the protective layer 163 may not be formed at an end portion of the flexible film 160. That is, the protective layer 163 is formed to have a smaller area than the base layer 161 to expose a part of the conductive layer 162, the second pad P2, and the third pad P3. Specifically, the protective layer 163 may expose the second pad P2, the conductive layer 162 adjacent to the second pad P2, the third pad P3, and the conductive layer 162 adjacent to the third pad P3. Specifically, an area of the flexible film 160 which is exposed by the protective layer 163 may overlap the display panel PNL or the printed circuit board PCB. The flexible film 160 may be connected to the display panel PNL or the printed circuit board PCB through the area of the flexible film 160 which is exposed by the protective layer 163.

The protective layer 163 includes a solder resist. For example, the solder resist may be formed of a curable resin which is cured by heat or light. Specifically, the protective layer 163 may include epoxy resin, phenol resin, urea resin, melamine resin, unsaturated polyester resin, resorcinol resin, saturated polyester resin, vinyl resin, acrylic resin, polyolefin resin, polyvinyl acetate resin, polycarbonate resin, cellulose resin, ketone resin, styrene resin, epoxy-based acrylic resin, polyester-based acrylic resin, urethane-based acrylic resin or the like, but is not limited thereto.

The plurality of holes 161a is formed to pass through the flexible film 160. Specifically, the plurality of holes 161a may be formed to pass through the base layer 161. The plurality of holes 161a is formed at an end portion of the flexible film 160. The plurality of holes 161a may be disposed in an area of the flexible film 160 where the protective layer 163 is not disposed. That is, the plurality of holes 161a may be disposed in an area adjacent to the second pad P2 which is exposed by the protective layer 163. In this case, an area where the plurality of holes 161a is disposed may overlap with the display panel PNL. The plurality of holes 161a may have a rectangular shape or a circular shape, but is not limited thereto.

In the meantime, the number and the arrangement structure of the second pad P2, the third pad P3, and the plurality of holes 161a are not limited to those illustrated in FIG. 3, but may vary depending on the design.

Referring to FIGS. 1 and 3, the driving IC DIC is mounted on the flexible film 160. Specifically, the driving IC DIC may be disposed on the protective layer 163, but is not limited thereto. The driving IC DIC may be disposed by a chip on glass (COG), a chip on film (COF), or a tape carrier package (TCP) depending on a mounting method. However, for the convenience of description, in the present disclosure, it is described that the driving IC DIC is mounted on the flexible films 160 by a chip on film method, but is not limited thereto.

The driving IC DIC is a component which processes a data signal for displaying images and various driving signals for processing the images. The driving IC DIC may include a gate driver IC, a data driver IC, and the like. The driving IC DIC supplies the driving signal to the display panel PNL through the plurality of conductive layers 162 to drive the display device 100.

Referring to FIG. 1, the printed circuit board PCB is connected to the plurality of flexible films 160. In this case, the printed circuit board PCB may be electrically connected to the flexible film 160 through the third pad P3. The printed circuit board PCB is a component which supplies signals to the driving IC DIC. Various components may be disposed on the printed circuit board PCB to supply various signals such as a driving signal or a data signal to the driving IC DIC. In the meantime, even though one printed circuit boards PCB is illustrated in FIG. 1, the number of printed circuit boards PCB may vary depending on the design and is not limited thereto.

In the meantime, even though not illustrated in FIG. 1, an additional printed circuit board which is connected to the printed circuit board PCB may be further disposed. For example, the printed circuit board PCB may be referred to as a source printed circuit board S-PCB on which the data driver is mounted and the additional printed circuit board connected to the printed circuit board PCB may be referred to as a control printed circuit board C-PCB on which the timing controller is mounted.

Referring to FIG. 1, the sealing member 180 is disposed on an overlapping area of the display panel PNL and the flexible film 160. The sealing member 180 may also be referred to as a micro coating layer. The sealing member 180 may be disposed so as to overlap the area of the flexible film 160 exposed by the protective layer 163. Therefore, the sealing member 180 may be disposed above the flexible film 160, inside the plurality of holes 161a of the flexible film 160, and in the overlapping area of the flexible film 160 and the display panel PNL. This will be described in more detail with reference to FIGS. 4A and 4B.

Figure 4A:
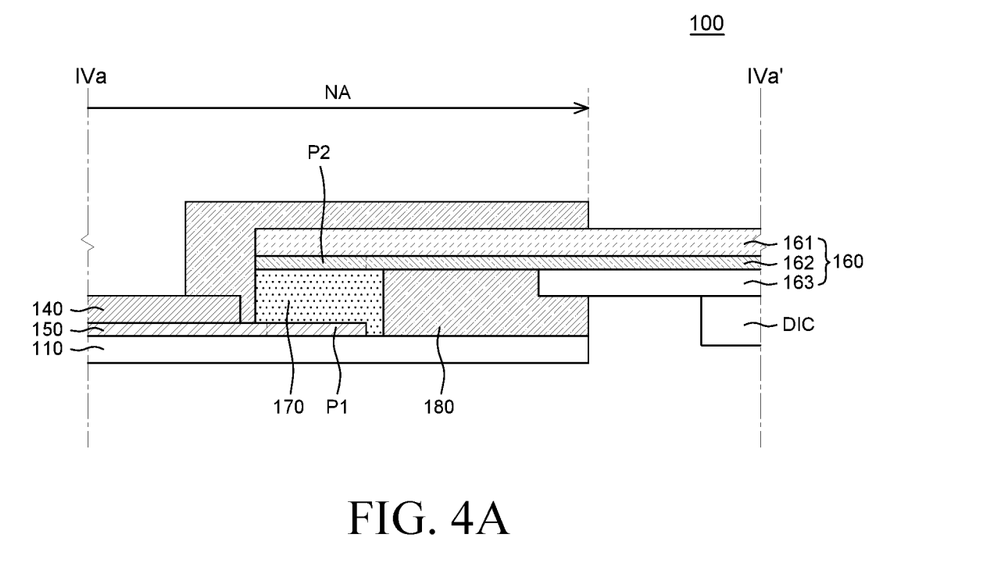
FIG. 4A is a cross-sectional view of an area corresponding to line IVa-IVa' of FIG. 3.

FIG. 4A is a cross-sectional view of an area corresponding to line IVa-IVa' of FIG. 3. FIG. 4B is a cross-sectional view of an area corresponding to line IVb-IVb' of FIG. 3. Specifically, FIGS. 4A and 4B illustrate a connection structure of the display panel PNL and the flexible film 160 in an area corresponding to line IVa-IVa' of FIG. 3 and an area corresponding to line IVb-IVb' of FIG. 3. For the convenience of illustration, in FIGS. 4A and 4B, only the substrate 110, the link line 150, the first pad P1, and the encapsulating substrate 140 of the display panel PNL are illustrated.

First, referring to FIG. 4A, a part of the flexible film 160 is disposed on the non-display area NA of the display panel PNL. In this case, an area where the display panel PNL and the flexible film 160 overlap may be defined as a pad unit. That is, the first pad P1 and the second pad P2 are disposed in the overlapping area of the display panel PNL and the flexible film 160. The first pad P1 of the display panel PNL and the second pad P2 of the flexible film 160 may be electrically connected by a conductive adhesive layer 170. Further, the sealing member 180 may be disposed on the overlapping area of the display panel PNL and the flexible film 160.

Specifically, the link line 150 is disposed on the substrate 110. The first pad P1 is disposed at an end of the link line 150. The first pad P1 may be exposed by the encapsulating substrate 140. In this case, the first pad P1 may be disposed on the non-display area NA of the substrate 110. In the meantime, even though in FIG. 4A, it is illustrated that the encapsulating substrate 140 partially exposes the first pad P1 and the link line 150 adjacent to the first pad P1, the present disclosure is not limited thereto. That is, the encapsulating substrate 140 may be disposed to expose only the first pad P1.

The flexible film 160 is disposed to overlap a part of the non-display area NA of the display panel PNL. In this case, the second pad P2 extending from the conductive layer 162 is disposed at an end portion of the flexible film 160. That is, the flexible film 160 may be disposed such that the second pad P2 and the first pad P1 are overlapping and facing each other. The second pad P2 may be disposed on the base layer 161 to be exposed by the protective layer 163. In this case, the protective layer 163 may be disposed to extend to the overlapping area of the display panel PNL and the flexible film 160. Even though in FIG. 4A, it is illustrated that the protective layer 163 partially exposes the second pad P2 and the conductive layer 162 adjacent to the second pad P2, the present disclosure is not limited thereto. That is, the protective layer 163 may be disposed to expose only the second pad P2.

The conductive adhesive layer 170 may bond the display panel PNL and the flexible film 160. The conductive adhesive layer 170 may electrically connect the first pad P1 and the second pad P2 to each other. The conductive adhesive layer 170 is disposed between the first pad P1 and the second pad P2 to overlap the first pad P1 and the second pad P2. The conductive adhesive layer 170 is an adhesive member including conductive particles, and for example, may be formed of an anisotropic conductive film (ACF), but is not limited thereto.

The conductive adhesive layer 170 is a film having a resin component including conductive balls to be used for adhesion and electrical conduction. That is, in the anisotropic conductive film, the conductive balls which are conductive particles are dispersed in a resin layer.

The conductive ball of the conductive adhesive layer 170 may be formed of a metal such as gold (Au), silver (Ag), tin (Sn), nickel (Ni), chrome (Cr), iron (Fe), cobalt (Co), platinum (Pt), or copper (Cu), and an alloy thereof. Alternatively, the conductive ball may be formed by a core containing glass, ceramic, or polymer resin, a metal formed on a surface of the core, or an alloy thereof, but is not limited thereto.

The resin layer of the conductive adhesive layer 170 has adhesive property and may be a curable organic polymer which is cured by heat or light. Specifically, the resin layer may be formed of a thermosetting resin and include epoxy resin, phenol resin, urea resin, melamine resin, unsaturated polyester resin, resorcinol resin, or the like, but is not limited thereto.

The display panel PNL and the flexible film 160 may be bonded, for example, by a tap bonding process. Specifically, in a state in which the conductive adhesive layer 170 is disposed between the substrate 110 of the display panel PNL and the flexible film 160, when a pressure is applied, the first pad P1 and the second pad P2 may be electrically connected by the conductive balls dispersed in the resin layer.

Figure 4B:
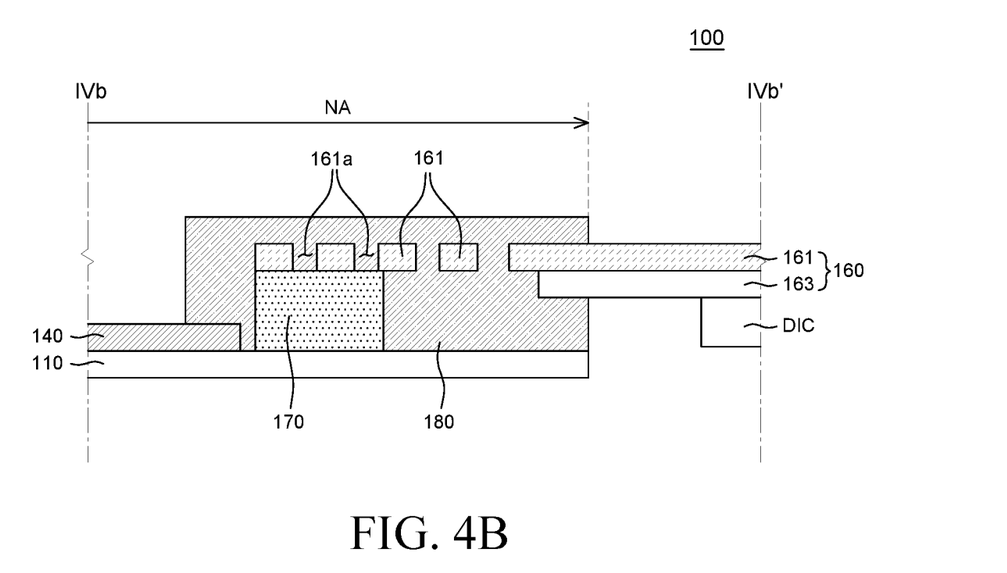
FIG. 4B is a cross-sectional view of an area corresponding to line IVb-IVb' of FIG. 3.

Referring to FIG. 4B, a plurality of holes 161a is formed in an overlapping area of the display panel PNL and the flexible film 160 where the first pad P1 and the second pad P2 are not disposed. In this case, the plurality of holes 161a may be disposed so as to be spaced apart from the second pad P2. The plurality of holes 161a allows the sealing member 180 to be filled in the overlapping area between the display panel PNL and the flexible film 160.

In the meantime, the conductive adhesive layer 170 may be entirely disposed along an edge of the end portion of the flexible film 160. Therefore, the display panel PNL and the flexible film 160 may be bonded by the conductive adhesive layer 170. That is, the conductive adhesive layer 170 may be disposed not only in an area where the first pad P1 and the second pad P2 are disposed, but also in a surrounding area thereof. Therefore, the substrate 110 and the base layer 161 may be bonded by the conductive adhesive layer 170.

Referring to FIGS. 4A and 4B, the sealing member 180 is disposed on an area where the display panel PNL and the flexible film 160 overlap. Specifically, the sealing member 180 may be disposed on the area where the display panel PNL and the flexible film 160 overlap to cover the display panel PNL and the flexible film 160. Further, the sealing member 180 may cover the overlapping area of the display panel PNL and the flexible film 160. By doing this, the sealing member 180 may protect the overlapping area of the display panel PNL and the flexible film 160.

Specifically, referring to FIG. 4B, the flexible film 160 includes the plurality of holes 161a which passes through the flexible film 160. Further, the sealing member 180 may be filled in the plurality of holes 161a and the area between the flexible film 160 and the display panel PNL. Specifically, the sealing member 180 may be formed by applying a curable resin material in the overlapping area of the display panel PNL and the flexible film 160 and curing the curable resin. In this case, the curable resin material may be filled in the area between the display panel PNL and the flexible film 160 through the plurality of holes 161a. Accordingly, the sealing member 180 may simultaneously cover the overlapping area of the display panel PNL and the flexible film 160 and be filled between the display panel PNL and the flexible film 160. That is, the sealing member 180 may allow the display panel PNL and the flexible film 160 to be more firmly fixed.

The sealing member 180 may be disposed to enclose a side portion of the conductive adhesive layer 170 and an end portion of the flexible film 160 in the overlapping area of the display panel PNL and the flexible film 160. In this case, the overlapping area of the display panel PNL and the flexible film 160 may correspond to the pad unit where the display panel PNL and the flexible film 160 are bonded. That is, in the overlapping area of the display panel PNL and the flexible film 160, the first pad P1, the second pad P2, and the conductive adhesive layer 170 are disposed. Since the sealing member 180 is disposed so as to enclose the pad unit, the permeation of the moisture or oxygen into the pad unit from the outside may be suppressed. Therefore, the bonding reliability of the pad unit is improved to improve a quality of the display device.

In the meantime, the sealing member 180 may be disposed inside more than the end portion of the substrate 110. When the sealing member 180 is disposed beyond the end portion of the substrate 110, it may be difficult to separate the support substrate after the tab bonding process. Specifically, when the substrate 110 is formed of a plastic material such as polyimide, due to the flexible property, a separate component for supporting the substrate 110 may be necessary. Therefore, when the display device 100 is manufactured, a support substrate which is formed of glass is disposed below the substrate 110 to perform the process and the support substrate may be released after completing the manufacturing process. If the sealing member 180 is disposed beyond the end portion of the substrate 110 to be in contact with the support substrate, it may be difficult to smoothly separate the support substrate. Therefore, the sealing member 180 may be disposed on the same line as the end portion of the substrate 110 or inside more than the end portion of the substrate 110.

The sealing member 180 may be formed of curable resin which is cured by heat or light. The curable resin may be formed of polyimide (PI), poly urethane, epoxy, or acryl-based material, but is not limited thereto.

Generally, after the tab bonding process of the display panel and the flexible film, the sealing member is disposed to cover the pad unit which is an overlapping area of the display panel and the flexible film. In this case, the sealing member is disposed above the flexible film so that there may be a space where the sealing member is not disposed between a lower portion of the flexible film and an upper portion of the display panel overlapping each other. Therefore, the flexible film and the display panel may be spaced apart from each other in this space. Specifically, in the case of a large size display, the area of the pad unit is increased so that the space where the flexible film and the display panel are spaced apart from each other may be increased. Therefore, the display panel and the flexible film may not be firmly fixed. Therefore, during the process of removing the support substrate disposed below the substrate during the LLO process, the flexible film may be floated or the substrate of the display panel may be curled. Specifically, when the substrate of the display panel is colored polyimide, the substrate has a low coefficient of thermal expansion (CTE) so that the curling of the substrate is not caused. In contrast, when the substrate is transparent polyimide, the substrate may be curled due to the high coefficient of thermal expansion. Accordingly, in the bottom emission type display panel in which the substrate is formed of transparent polyimide, the reliability of the display panel may be lowered due to the substrate curling phenomenon.

In the meantime, a part of the sealing member is permeated between both end portions of the flexible film and the display panel during the process of applying the sealing member to be disposed on a partial area between the display panel and the flexible film. Thereafter, when the sealing member is cured, ultraviolet (UV) ray which cures the sealing member is absorbed onto the protective layer of the flexible film so that the permeated sealing member is not cured. Therefore, a residual film may be generated. Furthermore, moisture or oxygen is permeated through the area where the conductive adhesive layer is exposed so that the reliability of the pad unit may be lowered.

The display device 100 according to the exemplary aspect of the present disclosure includes the plurality of holes 161a which passes through the flexible film 160, in the overlapping area of the display panel PNL and the flexible film 160. Further, the sealing member 180 may be disposed to be filled in the overlapping area between the display panel PNL and the flexible film 160 through the plurality of holes 161a. Accordingly, the display panel PNL and the flexible film 160 may be more firmly fixed. Therefore, the floating phenomenon of the flexible film 160 or the curling phenomenon of the substrate 110 of the display panel PNL may be minimized in the overlapping area of the display panel PNL and the flexible film 160.

Further, in the display device 100 according to the exemplary aspect of the present disclosure, the sealing member 180 may be disposed to enclose the conductive adhesive layer 170 in the overlapping area of the display panel PNL and the flexible film 160. Therefore, the display panel PNL and the flexible film 160 which are bonded by the conductive adhesive layer 170 may be more firmly bonded by the sealing member 180. Further, the area where the conductive adhesive layer 170 is disposed may correspond to the pad unit where the display panel PNL and the flexible film 160 are bonded. Accordingly, the permeation of the moisture and oxygen into the pad unit is suppressed by the sealing member 180 so that the reliability of the pad unit may be improved.

Figure 5A:
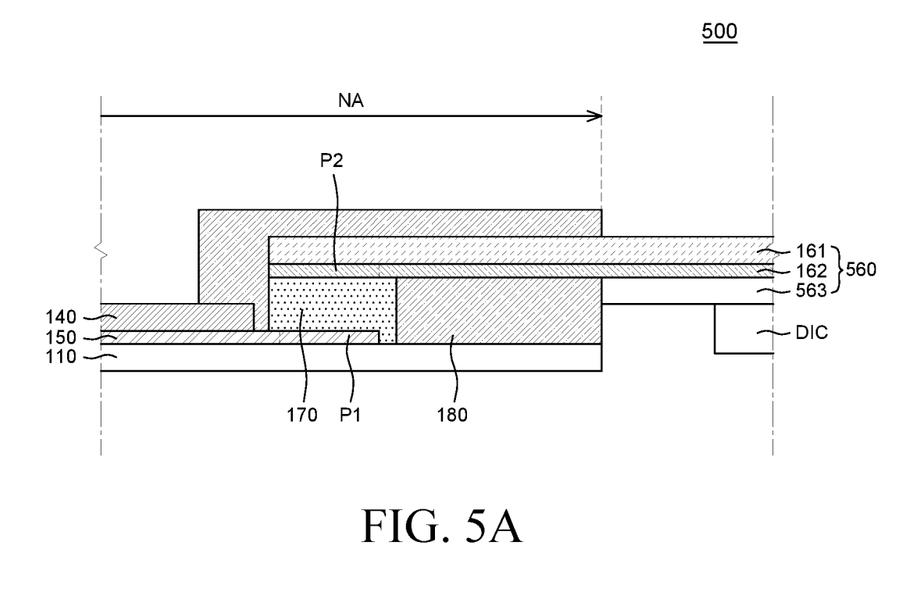
FIGS. 5A and 5B are cross-sectional views of a display device according to another exemplary aspect of the present disclosure.
Figure 5B:
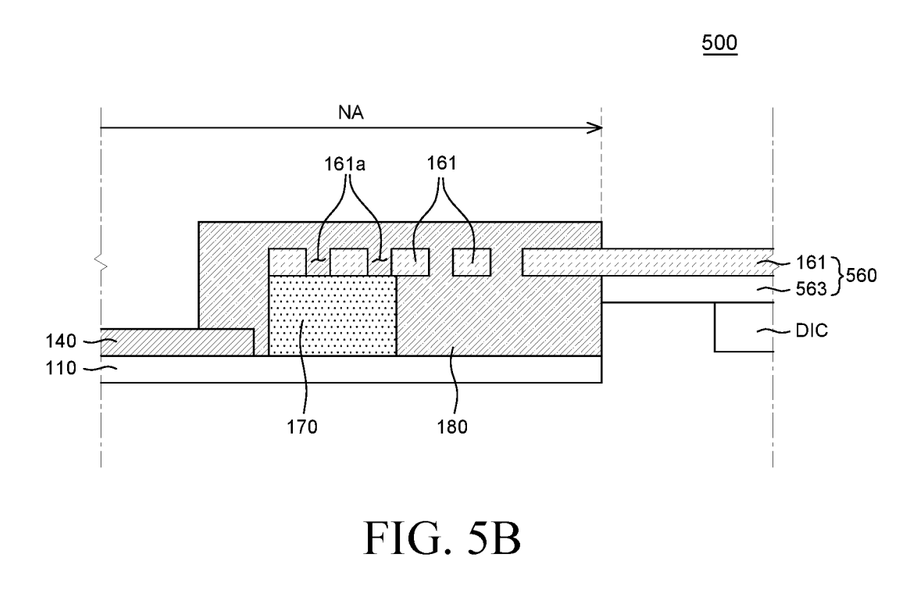

FIGS. 5A and 5B are cross-sectional views of a display device according to another exemplary aspect of the present disclosure. A display device 500 of FIGS. 5A and 5B may be substantially the same as the display device 100 of FIGS. 1 to 4B except for a structure of a protective layer 563 so that a redundant description will be omitted. For the convenience of illustration, in FIGS. 5A and 5B, only a substrate 110, a link line 150, a first pad P1, and an encapsulating substrate 140 of the display panel PNL are illustrated.

Referring to FIGS. 5A and 5B, the flexible film 560 is disposed to overlap a part of the non-display area NA of the display panel PNL. In this case, the protective layer 563 of the flexible film 560 may be disposed at an outside of an overlapping area of the display panel PNL and the flexible film 560. That is, the protective layer 563 may not overlap the display panel PNL. For example, an end of the protective layer 563 may be disposed only to an area corresponding to the end of the display panel PNL. Further, the protective layer 563 may be disposed at the outside of the sealing member 180. That is, the protective layer 563 may not overlap the sealing member 180. For example, an end of the protective layer 563 may be disposed only to an area corresponding to the end of the display panel PNL.

In the display device 500 according to another exemplary aspect of the present disclosure, the protective layer 563 may be disposed at an outside of the overlapping area of the display panel PNL and the flexible film 560. Specifically, the protective layer 563 may be disposed at the outside of the sealing member 180. That is, the sealing member 180 and the protective layer 563 do not overlap and the sealing member 180 may be completely exposed by the protective layer 563. Therefore, when the sealing member 180 is cured, the ultraviolet (UV) ray is uniformly absorbed in the entire area of the sealing member 180 so that the sealing member 180 may be more effectively cured. That is, the un-curing of the sealing member 180 is suppressed and a problem in that the residual film is caused by the uncured sealing member 180 may be solved.

Figure 6A:
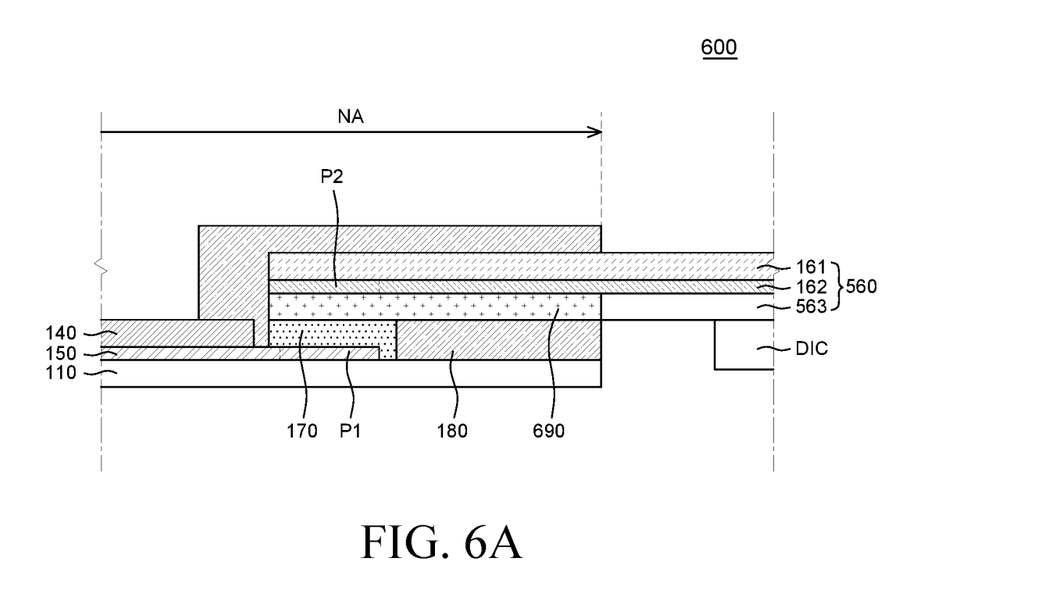
FIGS. 6A and 6B are cross-sectional views of a display device according to still another exemplary aspect of the present disclosure.
Figure 6B:
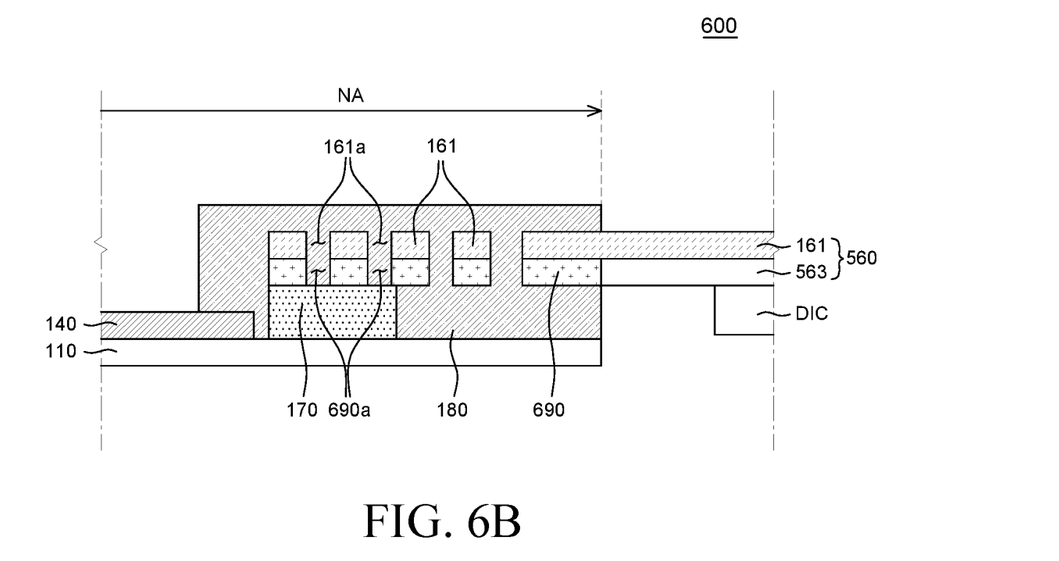

FIGS. 6A and 6B are cross-sectional views of a display device according to still another exemplary aspect of the present disclosure. A display device 600 of FIGS. 6A and 6B is substantially the same as the display device 500 of FIGS. 5A and 5B except that an auxiliary adhesive layer 690 is further provided, so that a redundant description will be omitted. For the convenience of illustration, in FIGS. 6A and 6B, only a substrate 110, a link line 150, a first pad P1, and an encapsulating substrate 140 of the display panel PNL are illustrated.

Referring to FIGS. 6A and 6B, an auxiliary adhesive layer 690 is disposed on an area of the flexible film 560 which overlaps the display panel PNL. In this case, the auxiliary adhesive layer 690 may be disposed between the display panel PNL and the flexible film 560. The auxiliary adhesive layer 690 may be disposed on an area of the flexible film 560 exposed by the protective layer 563. Specifically, the auxiliary adhesive layer 690 may be disposed on the conductive layer 162 and the second pad P2 exposed by the protective layer 563. Further, the auxiliary adhesive layer 690 may be disposed on the base layer 161 exposed by the protective layer 563. Therefore, the conductive adhesive layer 170 may be bonded to the flexible film 560 by the auxiliary adhesive layer 690.

The auxiliary adhesive layer 690 may include the same material as the resin layer of the conductive adhesive layer 170. As the auxiliary adhesive layer 690 includes the same material as the conductive adhesive layer 170, the adhesiveness between the auxiliary adhesive layer 690 and the conductive adhesive layer 170 may be improved. That is, the conductive adhesive layer 170 and the auxiliary adhesive layer 690 which include the same material are coupled to bond the display panel PNL and the flexible film 560 so that the bonding reliability of the display panel PNL and the flexible film 560 may be improved.

The auxiliary adhesive layer 690 has adhesive property and may be a curable organic polymer which is cured by heat or light. Specifically, the auxiliary adhesive layer 690 may be formed of a thermosetting resin and include epoxy resin, phenol resin, urea resin, melamine resin, unsaturated polyester resin, resorcinol resin or the like, but is not limited thereto.

In the meantime, conductive balls of the conductive adhesive layer 170 may be permeated in an area of the auxiliary adhesive layer 690 which overlaps the second pad P2. That is, since the auxiliary adhesive layer 690 and the conductive adhesive layer 170 are formed of the same resin layer, the conductive balls of the conductive adhesive layer 170 are permeated into the auxiliary adhesive layer 690 during the tab bonding process to provide electrical connection between the second pad P2 and the first pad P1. Accordingly, the auxiliary adhesive layer 690 may maintain the conductive property of the conductive adhesive layer 170 and improve the bonding characteristic of the display panel PNL and the flexible film 560, at the same time.

Referring to FIG. 6B, the auxiliary adhesive layer 690 includes a plurality of holes 690a corresponding to the plurality of holes 161a of the base layer 161. Specifically, the plurality of holes 690a may be formed to pass through the auxiliary adhesive layer 690 in the overlapping area of the display panel PNL and the flexible film 560. The plurality of holes 690a of the auxiliary adhesive layer 690 and the plurality of holes 161a of the base layer 161 may be connected. Further, the sealing member 180 may be filled in the plurality of holes 161a and 690a and the area between the flexible film 560 and the display panel PNL. That is, the sealing member 180 may cover the overlapping area of the display panel PNL and the flexible film 560 and be filled between the display panel PNL and the flexible film 560. Accordingly, the display panel PNL and the flexible film 560 may be more firmly fixed by the sealing member 180.

The display device 600 according to still another exemplary aspect of the present disclosure further includes the auxiliary adhesive layer 690 disposed on the area of the flexible film 560 which overlaps the display panel PNL. Specifically, the auxiliary adhesive layer 690 may be disposed on the base layer 161, the conductive layer 162, and the second pad P2 exposed by the protective layer 563. In this case, the auxiliary adhesive layer 690 may be formed of the same material as the resin layer of the conductive adhesive layer 170. Accordingly, the adhesiveness of the conductive adhesive layer 170 and the flexible film 560 is improved by the auxiliary adhesive layer 690 and the bonding reliability of the display panel PNL and the flexible film 560 may be improved.

The exemplary aspects of the present disclosure can also be described as follows:

According to an aspect of the present disclosure, there is provided a display device. The display device includes a display panel including a display area and a non-display area. The display device further includes a flexible film disposed on the non-display area of the display panel. The display device further includes a sealing member disposed on an overlapping area of the display panel and the flexible film to cover the flexible film. The flexible film includes a plurality of holes which passes through the flexible film in the overlapping area of the display panel and the flexible film. The sealing member is disposed to be filled in the plurality of holes.

The display panel may include a substrate formed of transparent polyimide (PI).

The sealing member may be disposed to be filled in the overlapping area of the display panel and the flexible film.

The sealing member may be disposed inside more than an end portion of the display panel.

The flexible film may include a base layer including the plurality of holes. The flexible film may further include a conductive layer on the base layer. The flexible film may further include a protective layer on the base layer and the conductive layer and exposes the plurality of holes and an end portion of the conductive layer. The end portion of the conductive layer may be connected to a pad disposed on the non-display area by a conductive adhesive layer.

The sealing member may be disposed to surround the conductive adhesive layer.

The protective layer may be disposed to extend to the overlapping area of the display panel and the flexible film.

The protective layer may be disposed at an outside of the overlapping area of the display panel and the flexible film.

The protective layer may be disposed at an outside of the sealing member.

The display device may further include an auxiliary adhesive layer disposed on the base layer and the conductive layer exposed by the protective layer.

The conductive adhesive layer may include a resin layer and a plurality of conductive balls and the auxiliary adhesive layer may include the same material as the resin layer.

The auxiliary adhesive layer may include a plurality of holes corresponding to the plurality of holes.

According to another aspect of the present disclosure, there is provided a display device. The display device includes a substrate including a display area and a non-display area. The display device further includes a flexible film disposed on the non-display area and connected to the substrate by a conductive adhesive layer. The display device further includes a micro coating layer on an overlapping area of the substrate and the flexible film and disposed to surround the conductive adhesive layer. The flexible film includes a plurality of holes which passes through the flexible film in the overlapping area of the substrate and the flexible film. The micro coating layer is disposed to be filled in an area between the substrate and the flexible film on the overlapping area of the substrate and the flexible film.

The substrate may be formed of transparent polyimide (PI).

The flexible film may include a base layer including the plurality of holes. The flexible film may further include a conductive layer on the base layer. The flexible film may further include a protective layer on the base layer and the conductive layer and exposes the plurality of holes and a part of the conductive layer. The conductive layer exposed by the protective layer may be electrically connected to a pad on the non-display area.

The protective layer may be disposed at an outside of the micro coating layer.

The display device may further include an auxiliary adhesive layer disposed on the base layer and the conductive layer exposed by the protective layer. The auxiliary adhesive layer may include a plurality of holes corresponding to the plurality of holes of the base layer.

The conductive adhesive layer may include a resin layer and a plurality of conductive balls. The auxiliary adhesive layer may include same material as the resin layer. An area of the auxiliary adhesive layer which overlaps the conductive adhesive layer may include the plurality of conductive balls.

The micro coating layer may be disposed inside more than an end portion of the substrate.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
    a display panel including a display area and a non-display area;
    a flexible film disposed on the non-display area of the display panel; and
    a sealing member covering the flexible film in an overlapping area of the display panel and the flexible film,
    wherein the overlapping area of the display panel and the flexible film is an area where the display panel and the flexible film overlap,
    wherein the flexible film includes a plurality of holes which passes through the flexible film in the overlapping area of the display panel and the flexible film, and
    wherein the sealing member is disposed to be filled in the plurality of holes.

2. The display device according to claim 1, wherein the display panel includes a substrate formed of transparent polyimide (PI).

3. The display device according to claim 1, wherein the sealing member is disposed to be filled between the display panel and the flexible film in the overlapping area of the display panel and the flexible film.

4. The display device according to claim 1, wherein the sealing member is disposed inside more than an end portion of the display panel.

5. The display device according to claim 1, wherein the flexible film includes:
    a base layer including the plurality of holes;
    a conductive layer on the base layer; and
    a protective layer on the base layer and the conductive layer and exposes the plurality of holes and an end portion of the conductive layer,
    wherein the end portion of the conductive layer is connected to a pad disposed on the non-display area by a conductive adhesive layer.

6. The display device according to claim 5, wherein the sealing member surrounds the conductive adhesive layer.

7. The display device according to claim 5, wherein the protective layer is disposed to extend to the overlapping area of the display panel and the flexible film.

8. The display device according to claim 5, wherein the protective layer is disposed at an outside of the overlapping area of the display panel and the flexible film.

9. The display device according to claim 5, wherein the protective layer is disposed at an outside of the sealing member.

10. The display device according to claim 5, further comprising an auxiliary adhesive layer disposed on the base layer and the conductive layer exposed by the protective layer.

11. The display device according to claim 10, wherein the conductive adhesive layer includes a resin layer and a plurality of conductive balls, and
    wherein the auxiliary adhesive layer includes the same material as the resin layer.

12. The display device according to claim 10, wherein the auxiliary adhesive layer includes a plurality of holes corresponding to the plurality of holes.

13. A display device, comprising:
    a substrate including a display area and a non-display area;
    a flexible film disposed on the non-display area and connected to the substrate by a conductive adhesive layer; and a micro coating layer surrounding the conductive adhesive layer in an overlapping area of the substrate and the flexible film,
wherein the overlapping area of the substrate and the flexible film is an area where the substrate and flexible film overlap,
wherein the flexible film includes a plurality of holes which passes through the flexible film in the overlapping area of the substrate and the flexible film, and
wherein the micro coating layer is disposed to be filled in an area between the substrate and the flexible film in the overlapping area of the substrate and the flexible film.

14. The display device according to claim 13, wherein the substrate is formed of transparent polyimide (PI).

15. The display device according to claim 13, wherein the flexible film includes:
a base layer including the plurality of holes;
a conductive layer on the base layer; and
a protective layer on the base layer and the conductive layer and exposes the plurality of holes and a part of the conductive layer,
wherein the conductive layer exposed by the protective layer is electrically connected to a pad on the non-display area.

16. The display device according to claim 15, wherein the protective layer is disposed at an outside of the micro coating layer.

17. The display device according to claim 15, further comprising an auxiliary adhesive layer disposed on the base layer and the conductive layer exposed by the protective layer,
wherein the auxiliary adhesive layer includes a plurality of holes corresponding to the plurality of holes of the base layer.

18. The display device according to claim 17, wherein the conductive adhesive layer includes a resin layer and a plurality of conductive balls,
wherein the auxiliary adhesive layer includes a same material as the resin layer.

19. The display device according to claim 18, wherein the auxiliary adhesive layer has an area overlapping with the conductive adhesive layer which includes the plurality of conductive balls.

20. The display device according to claim 13, wherein the micro coating layer is disposed inside more than an end portion of the substrate.

* * * * *